United States Patent
Yang et al.

(10) Patent No.: US 9,986,640 B2
(45) Date of Patent: May 29, 2018

(54) COIL COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventors: Ju Hwan Yang, Suwon-Si (KR); Jin Hyuck Yang, Suwon-Si (KR); Jong Yun Lee, Suwon-Si (KR); Won Chul Sim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 135 days.

(21) Appl. No.: 14/927,237

(22) Filed: Oct. 29, 2015

(65) Prior Publication Data

US 2016/0217905 A1 Jul. 28, 2016

(30) Foreign Application Priority Data

Jan. 27, 2015 (KR) .................... 10-2015-0012772

(51) Int. Cl.
| | |
|---|---|
| *H01F 5/00* | (2006.01) |
| *H01F 27/28* | (2006.01) |
| *H01F 7/06* | (2006.01) |
| *H05K 1/11* | (2006.01) |
| *H01F 41/04* | (2006.01) |

(Continued)

(52) U.S. Cl.
CPC .......... *H05K 1/113* (2013.01); *H01F 17/0013* (2013.01); *H01F 41/041* (2013.01); *H05K 1/165* (2013.01); *H01F 2017/002* (2013.01); *H05K 3/4644* (2013.01); *H05K 2201/086* (2013.01); *H05K 2201/09672* (2013.01)

(58) Field of Classification Search
CPC .............. H01F 17/0006; H01F 41/041; H01F 17/0013; H01F 27/2804
USPC .................... 336/200; 257/531; 29/602.1
See application file for complete search history.

(56) References Cited

U.S. PATENT DOCUMENTS

| | | | | |
|---|---|---|---|---|
| 6,037,649 A | * | 3/2000 | Liou | ........... H01L 23/5227 257/531 |
| 6,304,164 B1 | * | 10/2001 | Ohno | ............. H01F 17/0006 29/602.1 |

(Continued)

FOREIGN PATENT DOCUMENTS

| | | |
|---|---|---|
| JP | 2009-289781 A | 12/2009 |
| KR | 1999-0072351 A | 9/1999 |

(Continued)

OTHER PUBLICATIONS

Korean Office Action issued in Korean Application No. 10-2015-0012772, dated Dec. 3, 2015, with English Translation.

*Primary Examiner* — Elvin G Enad
*Assistant Examiner* — Joselito Baisa
(74) *Attorney, Agent, or Firm* — McDermott Will & Emery LLP

(57) ABSTRACT

A coil component includes coil conductors having a multi-layer structure including via pads, and vias connected between the via pads on the respective layers. Portions or overall regions of the via pads on two layers which are adjacent to each other overlap each other, and the vias in two layers which are connected to each other by the via pad formed therebetween are disposed in alternating positions.

17 Claims, 11 Drawing Sheets

(51) Int. Cl.
*H01F 17/00* (2006.01)
*H05K 1/16* (2006.01)
*H05K 3/46* (2006.01)

(56) References Cited

U.S. PATENT DOCUMENTS

| | | | | |
|---|---|---|---|---|
| 6,362,012 B1 * | 3/2002 | Chi | .................... | H01L 23/5223 257/275 |
| 6,713,162 B2 * | 3/2004 | Takaya | ................ | H03H 7/0115 333/184 |
| 6,992,557 B2 * | 1/2006 | Aoyagi | ............... | H01F 17/0033 336/200 |
| 7,262,680 B2 * | 8/2007 | Wang | ................. | H01F 17/0013 257/531 |
| 7,388,462 B2 * | 6/2008 | Ahn | .................... | H01F 17/0033 257/E27.046 |
| 8,314,496 B2 * | 11/2012 | Chen | ................... | H01F 17/0006 257/774 |
| 8,339,230 B2 * | 12/2012 | Hijioka | .............. | H01F 17/0013 29/602.1 |
| 8,405,482 B2 * | 3/2013 | Cho | .................... | H01L 23/5225 257/531 |
| 8,590,123 B2 * | 11/2013 | Yamamoto | ............ | C04B 35/265 29/25.41 |
| 8,754,723 B2 * | 6/2014 | Masuda | .................. | H01P 5/187 333/116 |
| 8,810,456 B2 * | 8/2014 | Kato | .................... | H01Q 1/2225 343/700 MS |
| 2009/0262041 A1 * | 10/2009 | Ikemoto | ........... | G06K 19/07749 343/860 |
| 2010/0157565 A1 * | 6/2010 | Yoshida | ................ | H01F 27/292 361/811 |
| 2011/0199713 A1 * | 8/2011 | Kato | ................ | G06K 19/07718 361/212 |
| 2012/0306607 A1 | 12/2012 | Jeong et al. | | |
| 2013/0335281 A1 * | 12/2013 | Dokai | ..................... | H01Q 9/06 343/748 |
| 2014/0036462 A1 * | 2/2014 | Wang | ................... | H01L 23/645 361/765 |
| 2014/0227874 A1 * | 8/2014 | LaCroix | ............. | H01L 23/5226 438/672 |
| 2015/0282333 A1 * | 10/2015 | Lin | ...................... | H05K 3/4611 156/150 |

FOREIGN PATENT DOCUMENTS

KR  10-2012-0033644 A  4/2012
KR  10-2012-0133570 A  12/2012

\* cited by examiner

COIL COMPONENT AND METHOD OF MANUFACTURING THE SAME

CROSS-REFERENCE TO RELATED APPLICATION

This application claims benefit of priority to Korean Patent Application No. 10-2015-0012772 filed on Jan. 27, 2015, with the Korean Intellectual Property Office, the disclosure of which is incorporated herein in its entirety by reference.

TECHNICAL FIELD

The present disclosure relates to a coil component, and more particularly, to a coil component used as a noise filter, and a method of manufacturing the same.

BACKGROUND

In accordance with technological developments, electronic devices such as mobile phones, home appliances, personal computers (PC), personal digital assistants (PDAs), liquid crystal displays (LCDs), and the like, have been changed from an analog scheme into a digital scheme, and electronic device speeds have increased due to an increase in an amount of data processed by the electronic devices.

Therefore, a universal serial bus (USB) 2.0, a USB 3.0, and a high-definition multimedia interface (HDMI) have widely been circulated as high speed signal transmitting interfaces, and have been used in many digital devices such as personal computers and digital high-definition televisions.

These high speed interfaces adopt a differential signal system transmitting differential signals (differential mode signals) using a pair of signal lines, unlike a single-end transmission system that has been generally used for a long period of time. However, the electronic devices that are digitized and have an increased speed are sensitive to a stimulus from the outside, such that distortion of signals due to high frequency noise has been often generated.

In order to remove this noise, a filter has been installed in electronic devices. For example, a common mode filter used as a coil component is used to remove common mode noise. Common mode noise is noise generated in the differential signal line, and the common mode filter removes the common mode noise that may not be removed by an existing filter. Accordingly, the common mode filter has been widely used in a high speed differential signal line, or the like.

In various coil products including the common mode filter, the numbers of coil turns and stacked coil layers are increased in order to obtain high inductance.

In this case, a via having a vertical structure and formed of a metal is required for interlayer connection of the coil layers. The via has a recessed structure, recessed to have a depth corresponding to a thickness of an insulating layer. When these vias are accumulated in the same position, a via non-plating defect may occur.

SUMMARY

An aspect of the present disclosure may provide a coil component in which vias in different layers are formed in alternating positions to be staggered with regard to each other, and a method of manufacturing the same.

According to an aspect of the present disclosure, a coil component may include coil conductors having a multilayer structure including via pads, and vias connected between the via pads on the respective layers. Portions or overall regions of the via pads on two layers which are adjacent to each other may overlap each other, and the vias in two layers which are connected to each other by the via pad formed between the two layers may be disposed in alternating positions.

The vias in the respective layers may be disposed in a zigzag position or a step position. When the vias are disposed in the step position, a width of an overlapping region between the via pads on the two layers which are adjacent to each other may be the same as a width of the via. When the vias are disposed in the zigzag position, the vias disposed in even layers or vias disposed in odd layers may be disposed on the common vertical lines.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
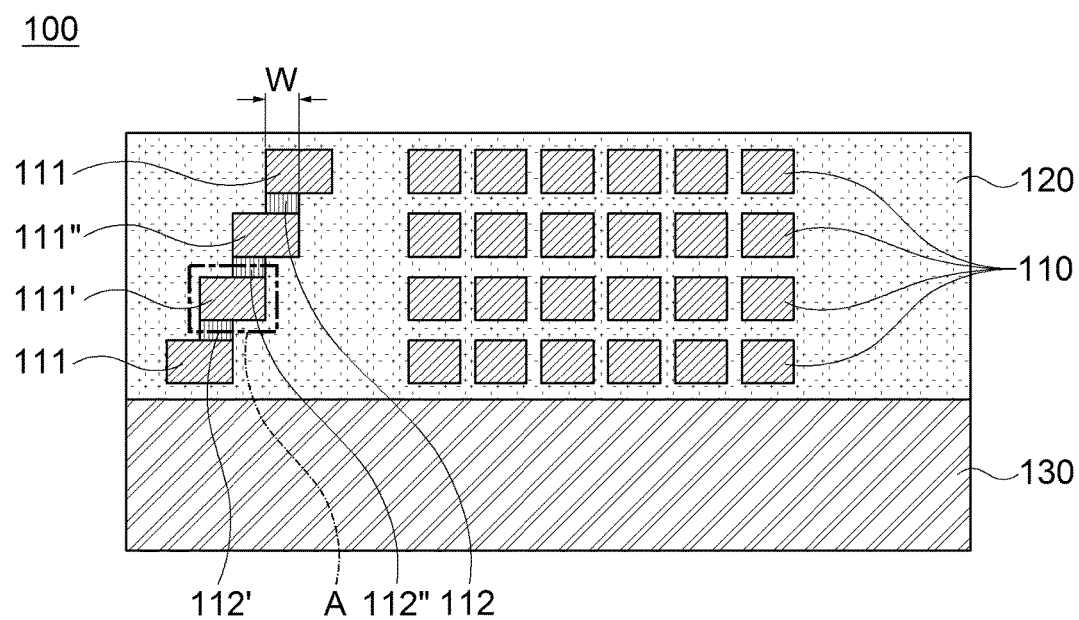
FIG. 1 is a cross-sectional view of a coil component according to a first exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view of a coil component according to a first exemplary embodiment. Referring to FIG. 1, a coil component 100, according to the exemplary embodiment, may include coil conductors 110 formed in a multilayer structure.

The coil conductors 110 may be embedded in an insulating layer 120, and the insulating layer 120 may be provided on a base substrate 130.

For instance, the exemplary embodiment relates to a coil component in which the coil conductors 110 are embedded in the insulating layer 120, or a structure in which the insulating layer 120 is laminated on the base substrate 130 is one unit element. The coil component may be manufactured in various sizes such as 2012 (2.0 mm×1.2 mm×1.2 mm), 1005 (1.0 mm×0.5 mm×0.5 mm), 0603 (0.6 mm×0.3 mm×0.3 mm), 0403 (0.4 mm×0.3 mm×0.3 mm), and the like.

The base substrate 130, which is a sintered body of a plate shape formed of a ferrite material, may serve as a movement path of magnetic flux generated when current is applied to the coil component 100. Thus, the magnetic substrate 130 may be formed of any magnetic material as long as it may obtain predetermined inductance. For example, the magnetic substrate 110 may be formed of one or more magnetic materials selected from an Ni based ferrite material containing $Fe_2O_3$ and NiO as main components, an Ni-Zn based ferrite material containing $Fe_2O_3$, NiO, and ZnO as main components, an Ni—Zn—Cu based ferrite material containing $Fe_2O_3$, NiO, ZnO, and CuO as main components, and the like.

Although the drawings illustrate a case in which the base substrate 130 formed of the ferrite material is formed on only one surface of the insulating layer 120, the present disclosure may provide a coil component in which a ferrite sintered body such as the base substrate 130 is formed on both surfaces of the insulating layer 120 in order to allow for smoother flow of the magnetic flux. In addition to this, the present disclosure may also provide a coil component in which a ferrite sintered body having a relatively high modulus is formed on a lower surface of the insulating layer 120 and a ferrite-resin composition formed by applying paste manufactured by milling a magnetic powder and a polymer resin is formed on an upper surface of the insulating layer 120.

The insulating layer 120 may be formed to surround the coil conductors 110 to secure interlayer insulation properties of the coil conductors 110 and protect the coil conductors 110 from external factors such as humidity, heat, or the like.

Therefore, as a material forming the insulating layer 120, a polymer resin having excellent insulation properties, thermal resistance, and moisture resistance, for example, an epoxy resin, a phenol resin, a urethane resin, a silicon resin, a polyimide resin, or the like may be used.

The insulating layer 120 may be formed by first forming a lower insulating layer securing insulation properties with the base substrate 130 and suppressing surface unevenness of the base substrate 130 to provide flatness, and sequentially laminating the coil conductors 110 and a build-up layer insulating layer covering the coil conductors 110 on the lower insulating layer. However, after a laminating process of high temperature and high pressure, boundaries between the respective layers may not be separated and may be integrated as illustrated in the drawings.

The coil conductors 110, which are metal wires having a coil shape formed on a plane, may be formed of at least one metal selected from the group consisting of silver (Ag), palladium (Pd), aluminum (Al), nickel (Ni), titanium (Ti), gold (Au), copper (Cu), or platinum (Pt) having excellent electrical conductivity.

The coil conductors 110 may be formed in a multilayer structure in which a plurality of coil conductors are laminated in a thickness direction of the coil component while having a predetermined interval formed therebetween, and the coil conductors 110 on each layer may form a primary coil and a secondary coil which are interconnected through vias 112 to be electromagnetically coupled to each other. Such features will be more apparent with reference to FIGS. 2 and 3.

Figure 2:
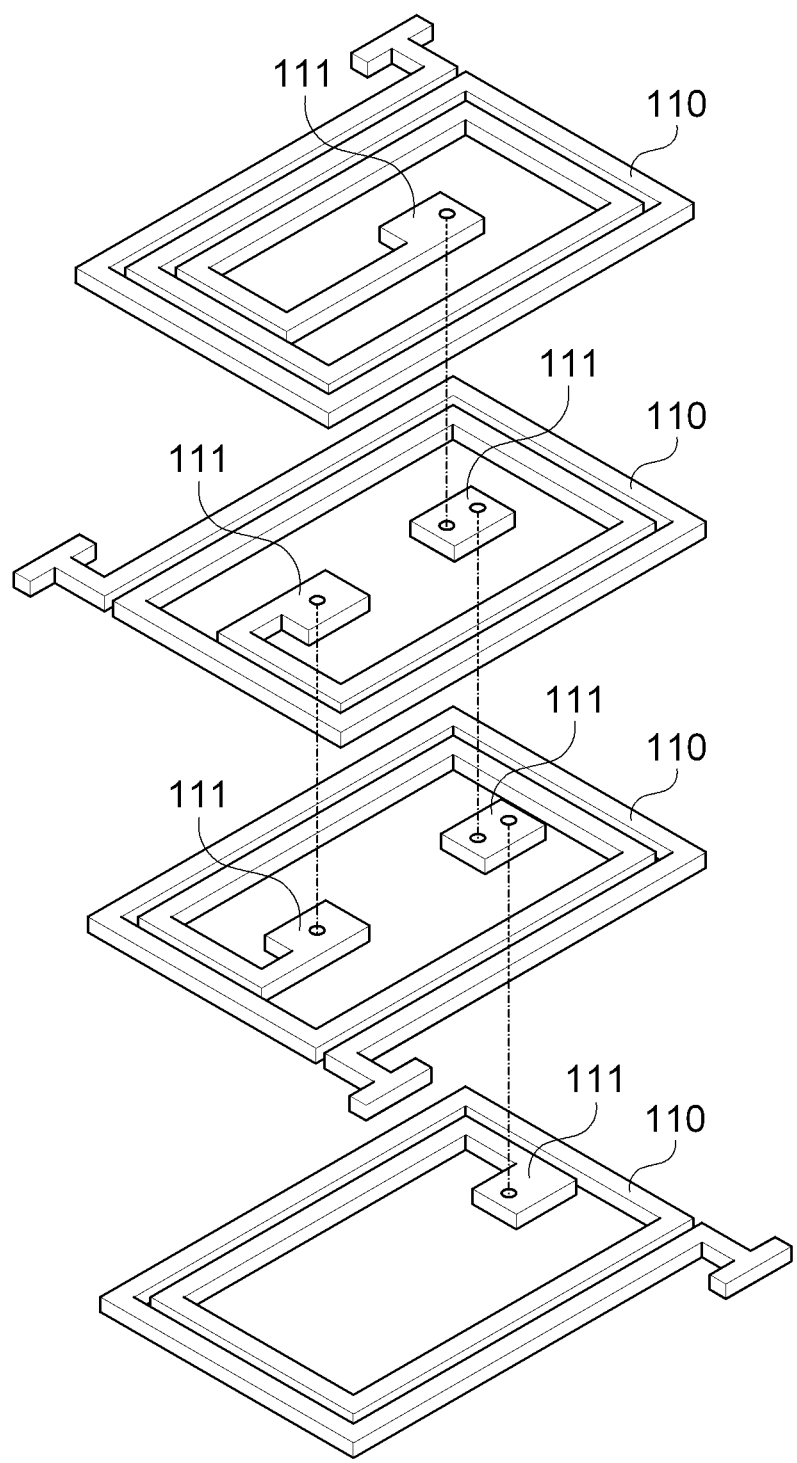
FIGS. 2 and 3 are exploded perspective views illustrating coil conductors included in the present disclosure for each layer.
Figure 3:
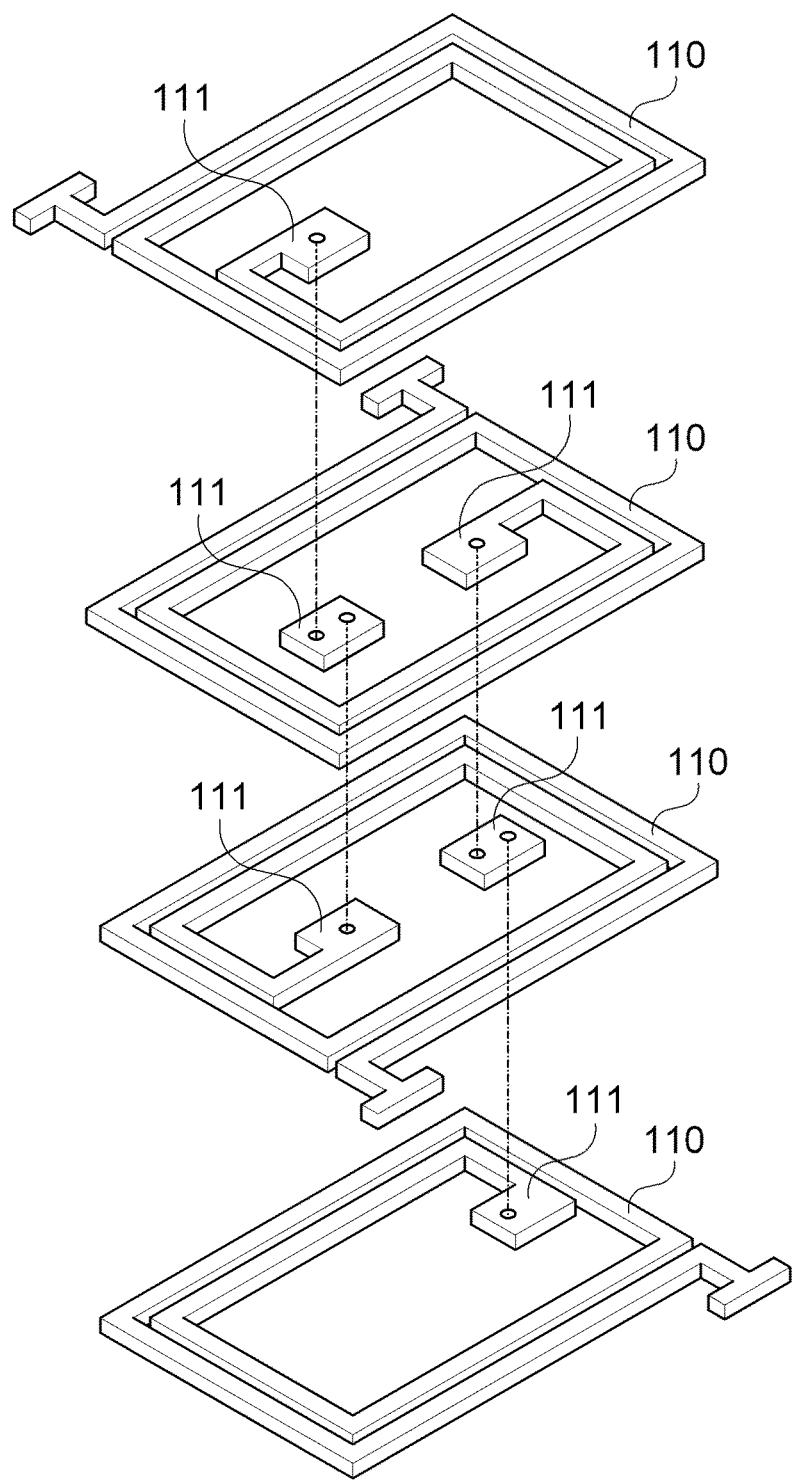

FIGS. 2 and 3 are exploded perspective views illustrating the coil conductors 110 for each layer in order to explain a connection structure of a coil. As illustrated in FIG. 2, the coil conductor 110 on a first layer may be connected to the coil conductor 110 on a fourth layer through a via pad 111 formed on a second layer and a via pad 111 formed on a third layer, and the coil conductor 110 on the second layer may be connected to the coil conductor 110 on the third layer.

Alternatively, as illustrated in FIG. 3, the coil conductor 110 on the first layer may be connected to the coil conductor 110 on the third layer through the via pad 111 formed on the second layer, and the coil conductor 110 on the second layer may be connected to the coil conductor 110 on the fourth layer through the via pad 111 formed on the third layer.

Thus, the coil component 100, according to the exemplary embodiment, may be operated as a common mode filter (CMF) in which, when current of the same direction is applied to the primary coil and the secondary coil, the magnetic fluxes are added to increase common mode impedance, and when current of the opposite direction is applied to the primary coil and the secondary coil, the magnetic fluxes are offset to decrease differential mode impedance.

The vias 112 may be provided between the via pads 111 formed on the respective layers. For instance, the via pads 111 may be land portions having a relatively wide area in order to secure connection reliability of the vias 112, and the vias 112 may connect between the via pads 111 on the respective layers in a vertical direction. Although the drawings illustrate the via pads 111 and the vias 112 to be separated from each other for a clear explanation, the via pads 111 and the vias 112, which are formed of the same metal, may be formed integrally with each other so that boundaries therebetween are not separated from each other.

Here, portions of the via pads 111 of two layers which are adjacent to each other, for example, a via pad 111' and a via pad 111" of FIG. 1 may overlap each other in the vertical direction, and the vias 112 of two layers which are connected to each other while having one via pad 111' formed therebetween, for example, a via 112' and a via 112" which are respectively in contact with upper and lower surfaces of the via pad 111' may not overlap each other in the vertical direction and may be disposed in alternating positions. The vertical direction refers to a direction vertical to a major surface of the base substrate 130 on which the coil conductors 110 are formed.

Figure 4:
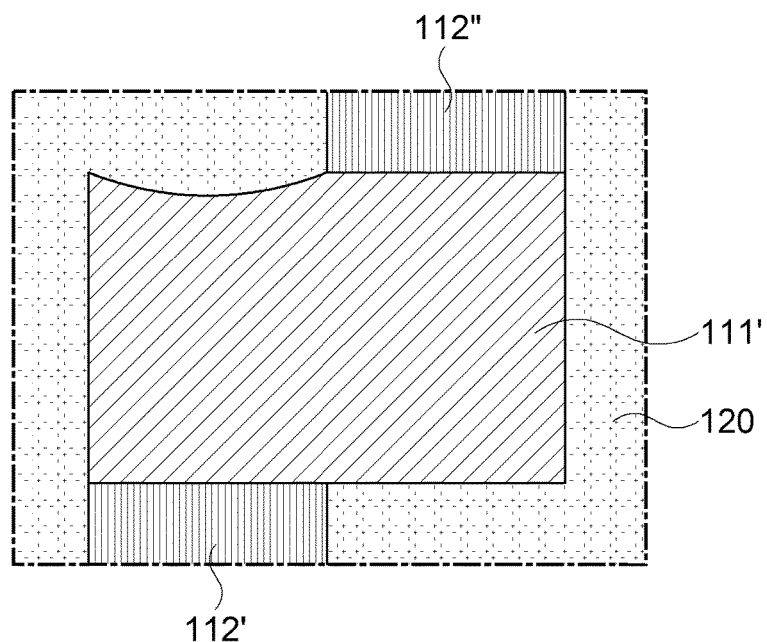
FIG. 4 is an enlarged view of region A of FIG. 1.

FIG. 4 is an enlarged view of region A of FIG. 1. During a plating process for forming the coil conductors 110, the via pads 111 and the vias 112 which are in contact with the lower surfaces of the via pads 111 may be simultaneously formed. Therefore, for example, a portion corresponding to the via 112' in the via pad 111' of FIG. 4 may not be plated up to a predetermined height and thus may have a depressed shape.

The via 112" formed by a next plating process in the via pad 111' having the above-mentioned shape may alternate with the via 112' so as to be formed on a flat surface of the via pad 111'. As a result, an open defect due to via non-plating may be prevented. This will be described in detail by a method of manufacturing a coil component to be described below.

The vias 112 of the overall layers may be positioned on different vertical lines. In this case, as illustrated in FIG. 1, in the exemplary embodiment in which portions of the via pads 111 overlap each other, a width W of the overlapping region may be set to have the same width as that of the vias 112. For instance, the vias 112 on the respective layers may be formed on the overlapping regions of the via pads 111. Therefore, longitudinal ends of the vias 112 and longitudinal ends of the via pads 111 may be positioned on a common line.

Here, a width of the via 112 may be set to be a half the width of the via pad 111. For example, a left half of the via pad 111' in FIG. 1 may be a region on which the via 112' is formed, and a right half of the via pad 111' may be a region on which the via 112" is formed.

As such, when the width of the via 112 is half the width of the via pad 111, since an amount of metal used when manufacturing the via pads 111 may be significantly reduced, production costs may be significantly reduced.

Figure 5:
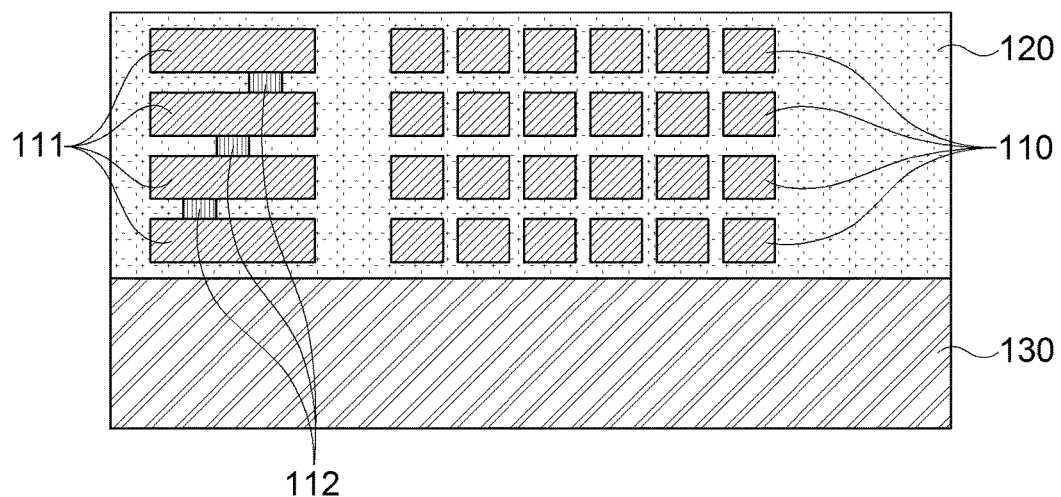
FIG. 5 is a cross-sectional view of a coil component according to a second exemplary embodiment in the present disclosure.

FIG. 5 is a cross-sectional view of a coil component according to a second exemplary embodiment.

Referring to FIG. 5, in a coil component 100 according to a second exemplary embodiment, the overall regions of the via pads 111 of the respective layers may overlap each other in the vertical direction, and the vias 112 connected between the via pads 111 may be positioned on different vertical lines in the overall layers. In this case, since positions of the via pads 111 may be easily aligned, a processing yield may be improved.

Figure 6:
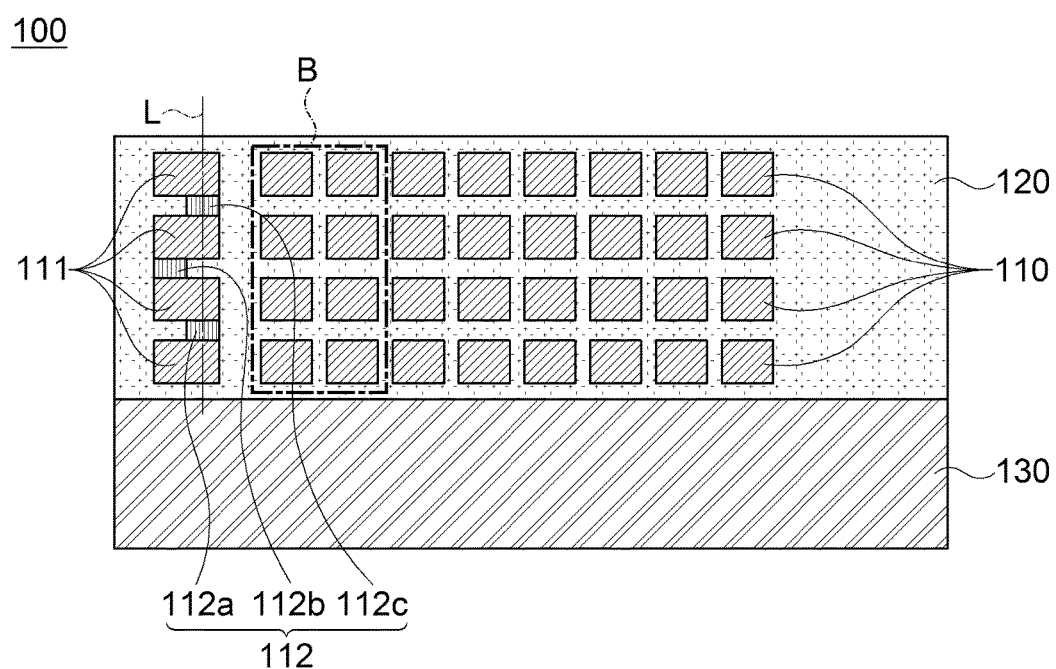
FIG. 6 is a cross-sectional view of a coil component according to a third exemplary embodiment in the present disclosure.

FIG. 6 is a cross-sectional view of a coil component according to a third exemplary embodiment.

Referring to FIG. 6, in a coil component 100 according a third exemplary embodiment, the vias 112 of the two layers which are connected to each other while having one via pad 111 formed therebetween, for example, two vias 112 which are each in contact with the upper and lower surfaces of the via pad 111, may not overlap each other in the vertical direction and may be disposed in alternating positions, as in the exemplary embodiment described above.

In addition, when the via 112 on the lowest layer to the via 112 on the uppermost layer sequentially refer to a first via 112a, a second via 112b, and a third via 112c, the second via 112b may be disposed at a left side of the first via 112a and the third via 112c may be again disposed at a right side of the second via 112b.

For instance, according to the present exemplary embodiment, the vias 112 may have a structure in which the vias 112 are disposed in a zigzag position. This structure may be possible when overall regions of the via pads 111 on the respective layers overlap each other as well as when only portions of the via pads 111 on the respective layers overlap each other.

The exemplary embodiment of FIG. 6 illustrates the case in which all of the via pads 111 on the respective layers overlap each other. Here, the first and third vias 112a and 112c disposed on odd layers are positioned on a single vertical line L, and longitudinal ends of the first and third vias 112a and 112c and longitudinal ends of the via pads 111 may be positioned on a common line. In addition, the second vias 112b disposed on even layers may be positioned on a single vertical line.

In the structure described above, when a width of the via 112 is a half the width of the via pad 111, since an area occupied by the via pads 111 in the coil conductors 110 may be significantly reduced, the number of turns of the coil conductors 110 may be increased.

This may be seen by comparing the number of turns of the coil conductors 110 illustrated in FIG. 1 and the number of turns of the coil conductors 110 illustrated in FIG. 6 with each other. It may be seen that a total number of coil turns of FIG. 6 is further increased by about two turns as compared to FIG. 1 because more wires are formed in a region B around the via pads 111.

Hereinafter, a method of manufacturing a coil component according to the exemplary embodiment will be described.

Figure 7:
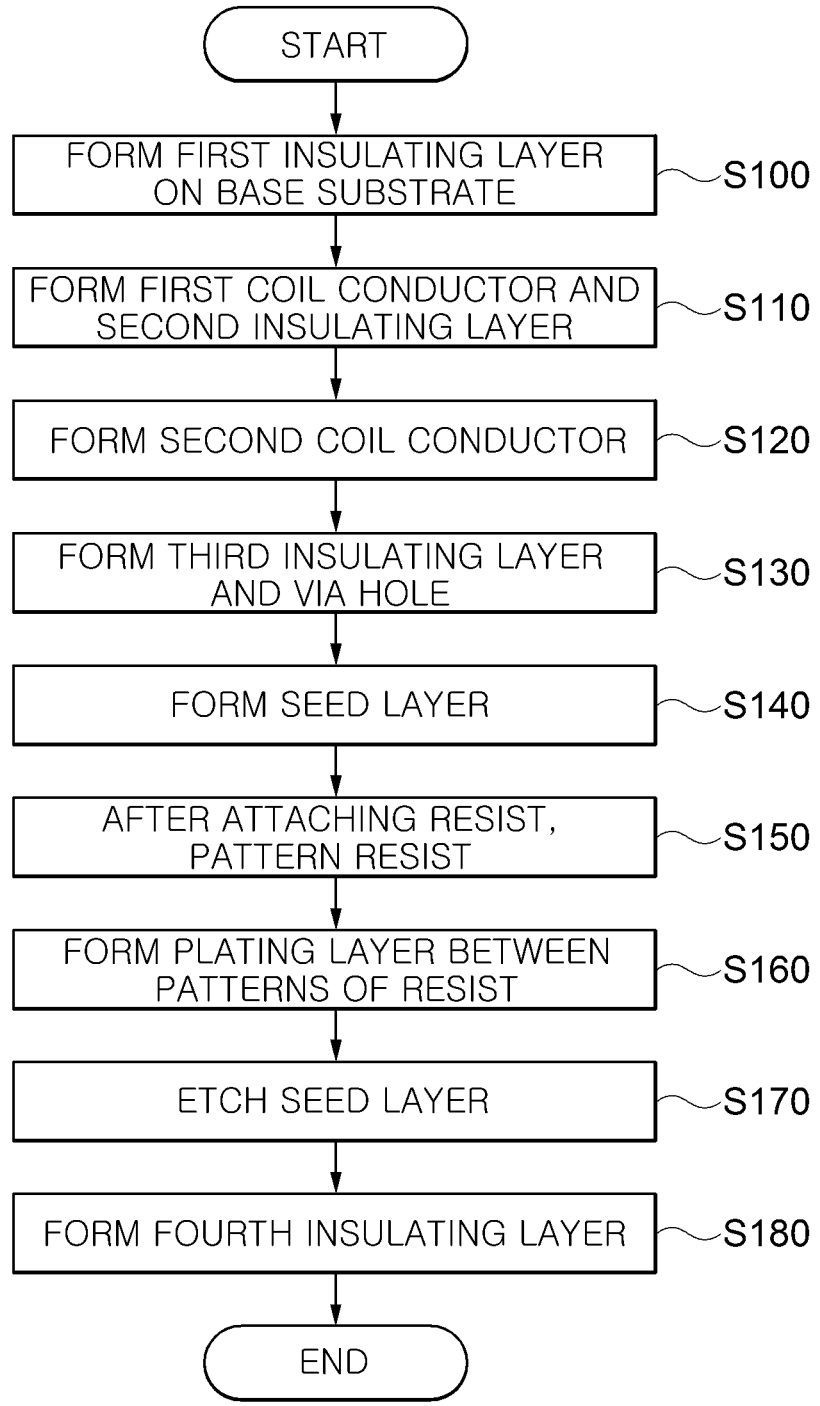
FIG. 7 is a flowchart sequentially illustrating a method of manufacturing a coil component according to an exemplary embodiment in the present disclosure.

FIG. 7 is a flowchart sequentially illustrating a method of manufacturing a coil component according to an exemplary embodiment, and FIGS. 8 to 17 are process views of the coil component illustrated in each operation.

Figure 8:
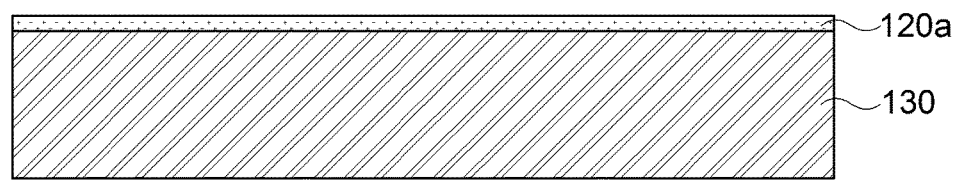
FIGS. 8 to 17 are process views of the coil component illustrated in each operation.

Referring to FIG. 7, in the method of manufacturing the coil component according to the exemplary embodiment, first, an operation of preparing a base substrate 130 manufactured by sintering a magnetic powder of an Ni based ferrite material, an Ni—Zn based ferrite material, or an Ni—Zn—Cu based ferrite material under a predetermined condition and forming a first insulating layer 120a on the base substrate 130 may be performed (S100 and FIG. 8).

The first insulating layer 120a, which is a layer for securing insulation properties between the coil conductors 110 and the base substrate 130 and suppressing a surface unevenness of the base substrate 130 to provide flatness to a surface on which the coil conductors 110 are formed, may be formed by applying a polymer resin such as an epoxy resin, a phenol resin, a urethane resin, a silicon resin, a polyimide resin, or the like by a typical coating method such as spin coating, or the like.

Figure 9:
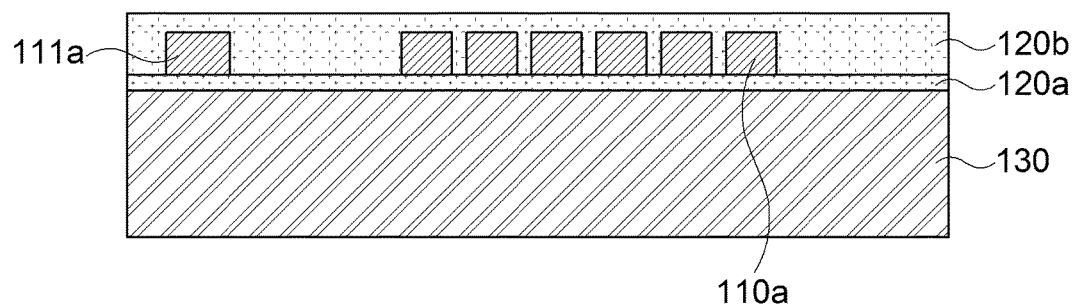

Next, an operation of forming a first coil conductor 110a including a first via pad 111a on the first insulating layer 120a and forming a second insulating layer 120b covering the first coil conductor 110a on the first insulating layer 120a may be performed (S110 and FIG. 9).

Figure 10:
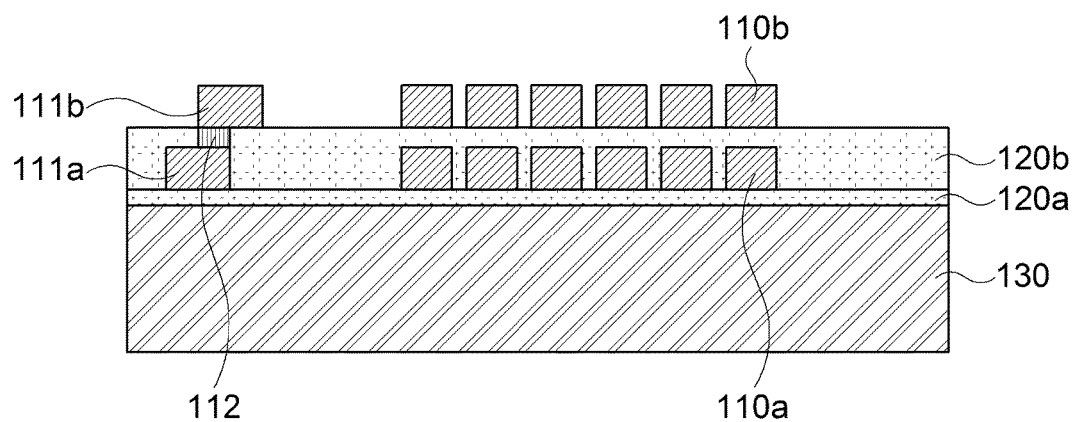

Then, an operation of forming a second coil conductor 110b including a second via pad 111b which is interconnected to the first via pad 111a through a via 112 formed on the first via pad 111a and partially overlapping the first via pad 111a on the second insulating layer 120b may be performed (S120 and FIG. 10). Although the present exemplary embodiment describes a structure in which portions of the via pads 111 overlap each other, the overall regions of the via pads 111 may overlap with each other when the coil component is manufactured according to the exemplary embodiment of FIG. 5 or 6.

The first coil conductor 110a and the second coil conductor 110b, including the vias 112, may be formed by the same method as a method of manufacturing a third coil conductor (110c in FIG. 16) to be described below.

Figure 11:
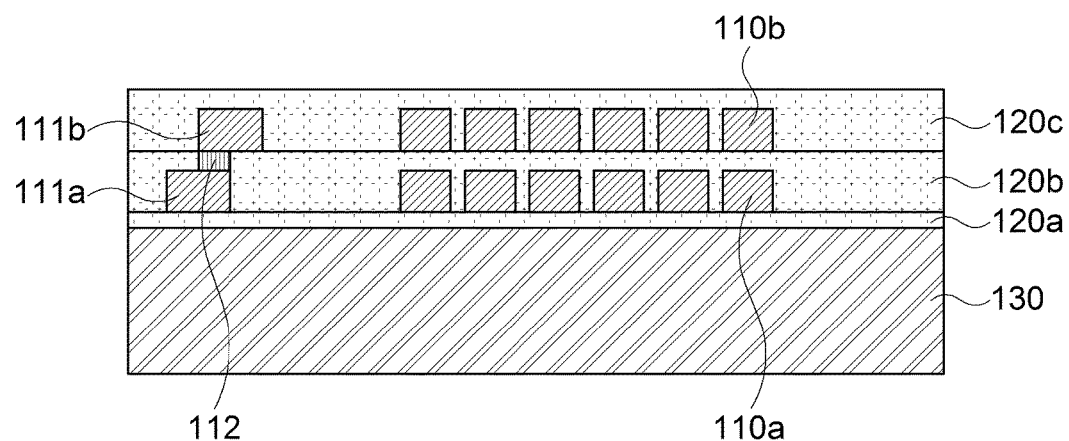
Figure 12:
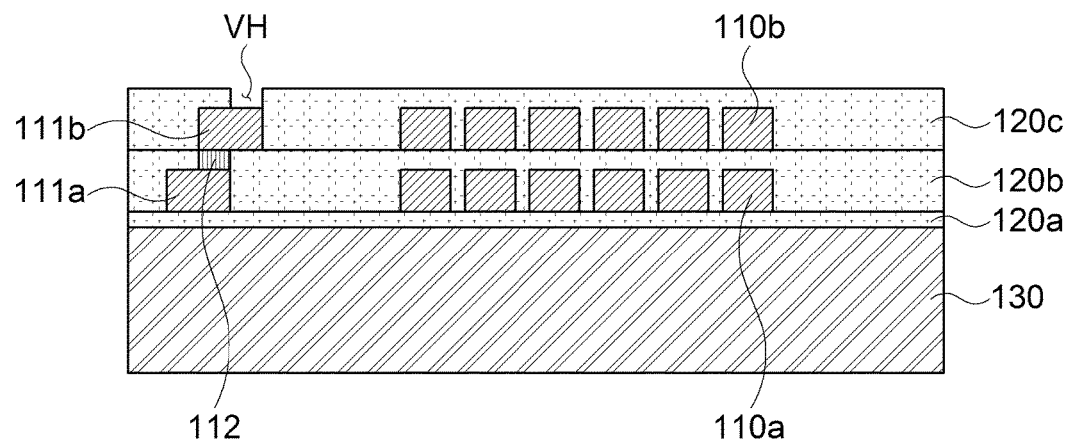

In order to form the third coil conductor 110c, first, as illustrated in FIG. 11, an operation of a third insulating layer 120c covering the second coil conductor 110b on the second insulating layer 120b and forming a via hole VH which does not overlap the via 112 in a vertical direction in the third insulating layer 120c to expose a portion of the second via pad 111b may be performed (S130 and FIG. 12).

Figure 13:
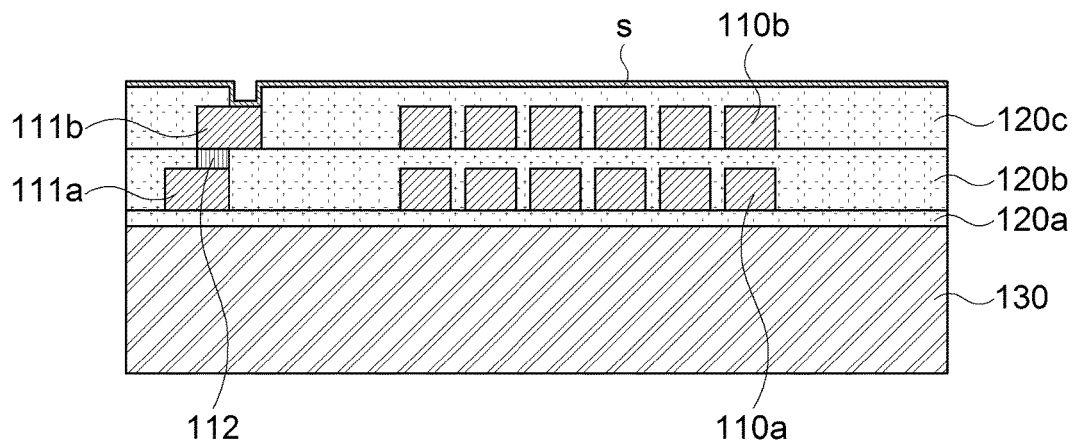

Next, a seed layer s may be formed on the third insulating layer 120c as well as on an inner wall of the via hole VH (S140 and FIG. 13). The seed layer s, which is a layer becoming a lead line for performing electroplating, may be formed by electroless copper plating.

Figure 14:
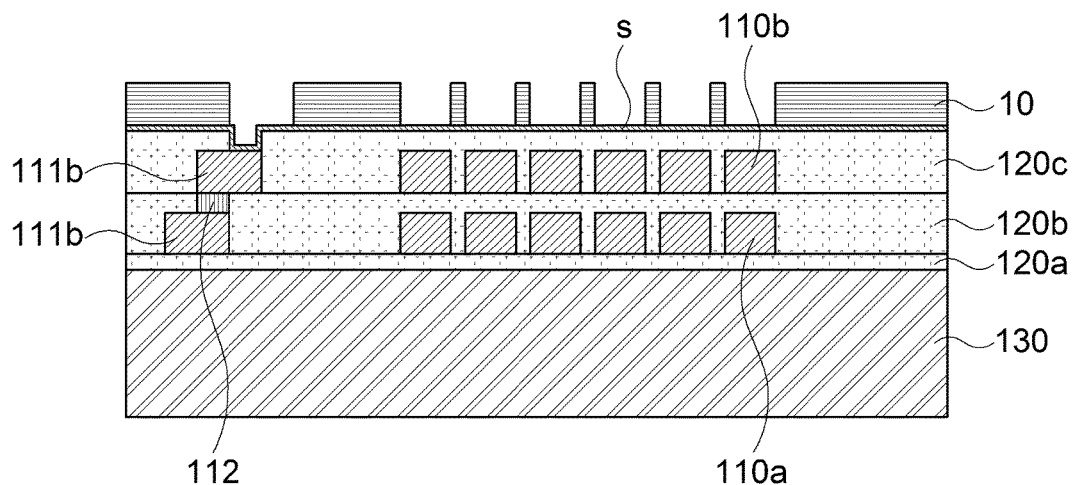

Next, after a resist 10 is attached to the seed layer s, the resist 10 may be patterned (S150 and FIG. 14). The resist 10 may be a member formed of a photosensitive polymer material. As the resist 10, a negative type in which a light reaction occurs at a portion receiving light at the time of exposure and the portion receiving light is left at the time of development, and a positive type in which the portion receiving light is removed at the time of the development, may be used.

Patterns formed on the resist 10 by the exposure and development described above may become opposite to patterns of the third coil conductor 110c. Thus, when a metal is grown between the patterns of the resist 10 by electroplating as illustrated in FIG. 15, a plating layer 110c' having patterns corresponding to the third coil conductor 110c may be formed (S160).

Figure 16:
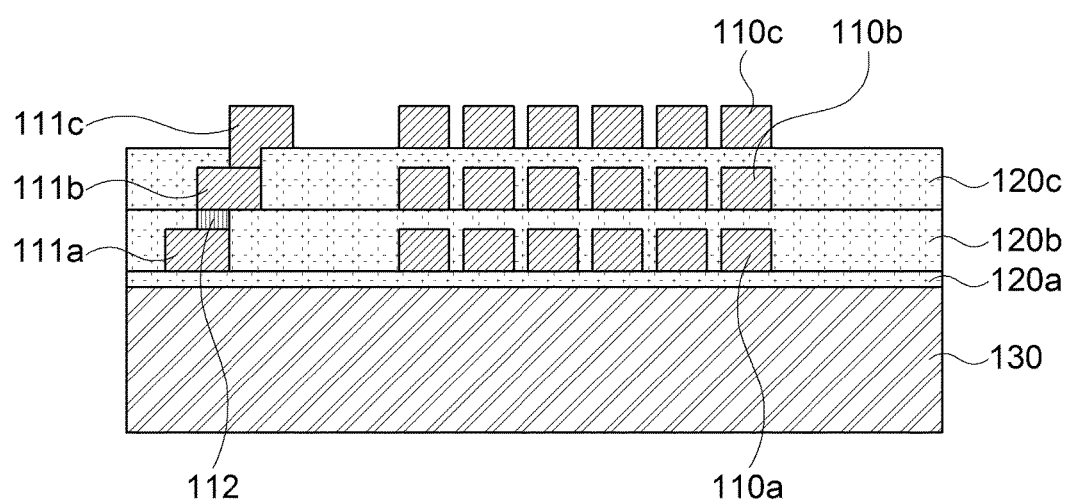

Next, when the seed layer s externally exposed to after removing the resist 10, for instance, the seed layer s on portions covered by the resist 10 so as not to form the plating layer 110c' is removed by flash etching, or the like, the third coil conductor 110c including the third via pad 111c may be formed (S170 and FIG. 16). As described above, although the first coil conductor 110a, the second coil conductor 110b, and the third coil conductor 110c include the seed layer s, since a thickness of the seed layer s is very thin as compared to the overall thickness, the seed layer s will not be illustrated from FIG. 16.

Figure 15:
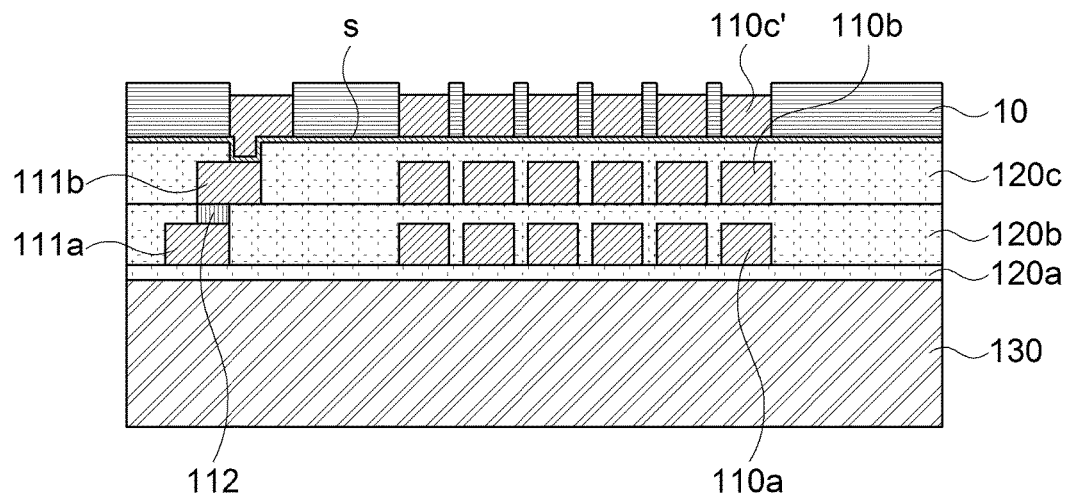

Although not illustrated in detail, since the metal is grown from a bottom of the via hole VH at the time of the plating process of FIG. 15, a portion corresponding to the via hole VH in the third via pad 111c may not be plated up to a predetermined height and may have a depressed shape. The same shape may be similarly exhibited in the second via pad 111b formed by the same method.

For instance, a portion corresponding to the via 112 in the second via pad 111b may not be plated up to a predetermined height and may have a depressed shape. According to the exemplary embodiment, the via hole VH is formed at a position which does not overlap the via 112, whereby a non-plating defect may be prevented.

Figure 18:
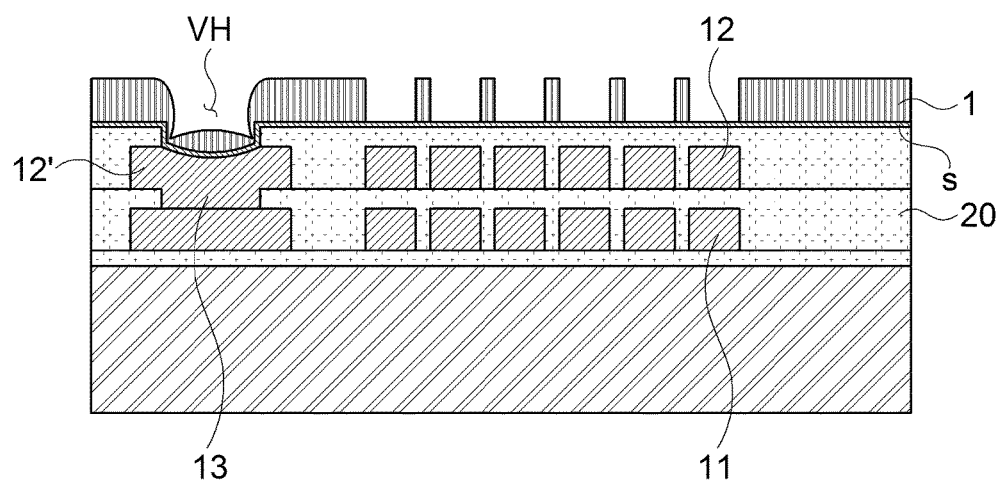
FIG. 18 is a view illustrating a non-plating defect which occurs when a coil component is manufactured according to the related art.

FIG. 18 is a view illustrating a non-plating defect which may occur at when a coil component is manufactured according to the related art.

Referring to FIG. 18, since a second via pad 12' is formed simultaneously with a via 13, an upper surface of the second via pad 12' may be depressed. Therefore, during a process of patterning a resist 1, residue may be left on the upper surface of the second via pad 12'. As a result, even though electroplating is performed using a seed layer s as a lead line, a metal is not grown in the via hole VH, and thus an open defect due to via non-plating may occur.

Figure 17:
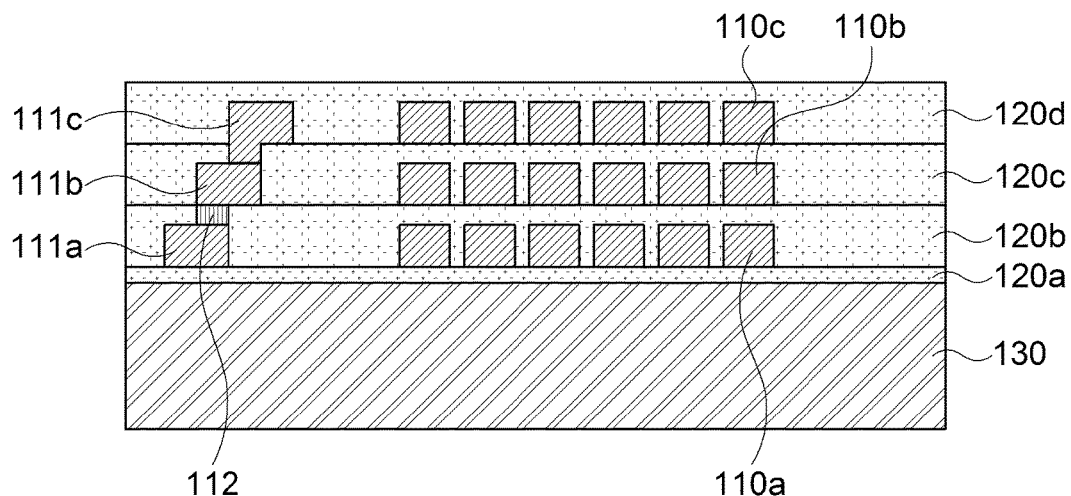

As illustrated in FIG. 17, in the case in which the third coil conductor 110c is formed, a fourth insulating layer 120d covering the third coil conductor 110c is formed on the third insulating layer 120c, and thus formation of the coil component according to the exemplary embodiment may be completed (S180 and FIG. 17).

Although the present exemplary embodiment describes the coil conductors 110 having a structure of three layers, coil conductors 110 having a significant number of layers may be formed according to a required specification, and the vias 112 may also be formed in a zigzag position in addition to a step position.

As set forth above, according to the exemplary embodiments, in the coil component, since flatness is provided to a surface in which the vias are formed, a via non-plating defect may be prevented.

While exemplary embodiments have been shown and described above, it will be apparent to those skilled in the art that modifications and variations could be made without departing from the scope of the present invention as defined by the appended claims.

What is claimed is:

1. A coil component comprising:
a plurality of conductive patterns embedded in a plurality of insulating layers and stacked on each other, each conductive pattern including a coil conductor and a via pad; and
a plurality of vias connecting the via pads embedded in the plurality of insulating layers,
wherein portions or overall regions of the via pads embedded in two immediately adjacent insulating layers among the plurality of insulating layers overlap each other in a direction along which the plurality of conductive patterns are stacked on each other,
the vias are alternately disposed, and
a coil conductor and a via pad that are both embedded in one of the plurality of insulating layers are spaced-apart from each other.

2. The coil component of claim 1, wherein the plurality of vias are positioned on different vertical lines parallel to the direction along which the plurality of conductive patterns are stacked.

3. The coil component of claim 1, wherein longitudinal ends of the plurality of vias and longitudinal ends of the via pads are positioned on a common line parallel to the direction along which the plurality of conductive patterns are stacked.

4. The coil component of claim 1, wherein a width of the via is a half a width of the via pad.

5. The coil component of claim 1, wherein the plurality of insulating layers are disposed on a base substrate.

6. The coil component of claim 5, wherein the base substrate is provided as a ferrite sintered body.

7. The coil component of claim 1, wherein a pair of the vias disposed on opposite sides of the via pad embedded in the one of the plurality of insulating layers are in contact with the via pad embedded in the one of the plurality of insulating layers.

8. A coil component comprising:
a plurality of conductive patterns embedded in a plurality of insulating layers and stacked on each other, each conductive pattern including a coil conductor and a via pad; and
a plurality of vias connected between the via pads embedded in the plurality of insulating layers,
wherein portions or overall regions of the via pads embedded in two immediately adjacent insulating layers among the plurality of insulating layers overlap each other,
the vias are alternately disposed,
the vias disposed in even insulating layers or the vias disposed in odd insulating layers are positioned on a common vertical line parallel to a direction along which the plurality of conductive patterns are stacked, and
a coil conductor and a via pad that are both embedded in one of the plurality of insulating layers are spaced-apart from each other.

9. The coil component of claim 8, wherein longitudinal ends of the vias and longitudinal ends of the via pads are positioned on a common line parallel to the direction along which the plurality of conductive patterns are stacked.

10. The coil component of claim 8, wherein a width of the via is a half a width of the via pad.

11. The coil component of claim 8, wherein the plurality of insulating layers are disposed on a base substrate.

12. The coil component of claim 11, wherein the base substrate is provided as a ferrite sintered body.

13. The coil component of claim 8, wherein a pair of the vias disposed on opposite sides of the via pad embedded in the one of the plurality of insulating layers are in contact with the via pad embedded in the one of the plurality of insulating layers.

14. A method of manufacturing a coil component, the method comprising:
    forming a first coil conductor and a first via pad on a first insulating layer, and forming a second insulating layer covering the first coil conductor and the first via pad on the first insulating layer;
    forming a second coil conductor and a second via pad which is interconnected to the first via pad through a first via formed on the first via pad and which partially or wholly overlaps the first via pad, on the second insulating layer;
    forming a third insulating layer covering the second coil conductor and the second via pad, on the second insulating layer, and forming a via hole which does not overlap the via formed on the first via pad to expose a portion of the second via pad; and
    forming a third coil conductor and a third via pad which is interconnected to the second via pad through a second via formed in the via hole by plating and which partially or wholly overlaps the second via pad, and forming a fourth insulating layer covering the third coil conductor and the third via pad on the third insulating layer,
    wherein the second coil conductor and the second via pad are spaced-apart from each other, or the third coil conductor and the third via pad are spaced-apart from each other.

15. The method of claim 14, wherein the forming of the third coil conductor and the third via pad comprises:
    forming a seed layer on the third insulating layer and on an inner wall of the via hole,
    patterning a resist layer after attaching the resist layer onto the seed layer,
    growing a metal between patterns of the patterned resist, and
    etching the seed layer externally exposed after removing the resist.

16. The method of claim 14, wherein the first insulating layer is formed on a base substrate before the forming of the first coil conductor and the first via pad, and the first coil conductor and the first via pad are formed on the first insulating layer.

17. The method of claim 14, wherein the first via and the second via are formed on opposite sides of the second via pad, are in contact with the second via pad, and are not aligned to each other in a direction along which the first, second, and third coil conductors are stacked on each other.

* * * * *